United States Patent
Xu (10) Patent No.: US 7,714,620 B1
(45) Date of Patent: May 11, 2010

(54) COMPARATOR WITH AMPLITUDE AND TIME HYSTERESIS

(75) Inventor: Chao Xu, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 845 days.

(21) Appl. No.: 11/422,381

(22) Filed: Jun. 6, 2006

(51) Int. Cl.
*H03K 5/22* (2006.01)
*H03K 5/153* (2006.01)

(52) U.S. Cl. .............................. 327/63; 327/76; 327/75; 327/78

(58) Field of Classification Search .................. 327/50, 327/74–80, 63
See application file for complete search history.

(56) References Cited

U.S. PATENT DOCUMENTS

| | | | |
|---|---|---|---|
| 4,676,634 A * | 6/1987 | Petersen | ..................... 356/4.08 |
| 4,958,133 A | 9/1990 | Bazes | |
| 5,963,079 A | 10/1999 | Hoang | |
| 5,994,971 A * | 11/1999 | Edwards | ................. 331/107 R |
| 6,815,940 B2 * | 11/2004 | Nakashimo | ................. 323/288 |
| 6,894,542 B2 | 5/2005 | Prexl | |
| 6,924,709 B2 * | 8/2005 | Bashar | ....................... 331/143 |
| 6,957,278 B1 | 10/2005 | Gallagher | |
| 6,970,022 B1 | 11/2005 | Miller | |
| 6,982,582 B1 | 1/2006 | Cheng | |
| 7,034,627 B1 * | 4/2006 | Kudari | ....................... 331/143 |

* cited by examiner

*Primary Examiner*—Dinh T. Le
(74) *Attorney, Agent, or Firm*—Stanley J. Pawlik; Kenneth Glass; Glass & Associates (57) ABSTRACT

A comparator generates lower and upper reference voltages to establish an amplitude hysteresis. A first comparator circuit generates a first comparison signal indicating whether an input signal is above the upper reference voltage. A second comparator circuit generates a second comparison signal indicating whether the input signal is below the lower reference voltage. Further, the first and second comparison signals may be low-pass filtered to establish a time hysteresis. A latch is set to a first state if the first control signal indicates the input signal is above the upper reference voltage. The latch is set to a second state if the second control signal indicates the input signal is below the lower reference voltage. In some embodiments, the comparator has a rail-to-rail common mode input voltage range, a low-power mode of operation, and is self-biased to compensate for temperature, voltage, and process characteristics.

22 Claims, 4 Drawing Sheets

COMPARATOR WITH AMPLITUDE AND TIME HYSTERESIS

BACKGROUND

1. Field of the Invention

The present invention generally relates to electronic circuits, and more particularly to comparator circuits having hysteresis.

2. Description of Related Art

A comparator is an electronic device that compares two input voltages or currents, and switches its output between two states to indicate which input is larger. Such a comparator is widely used to determine if an input is above or below a reference voltage. Some comparators have a voltage hysteresis to prevent rapid switching of its output between states as the input drifts around the reference voltage. For example, noise may cause the input to drift around the reference voltage as the input transitions across the reference voltage. A comparator with hysteresis typically switches its output to one state when the input exceeds an upper voltage and to another state when the input falls below a lower voltage. When the input is between the upper voltage and the lower voltage, the comparator does not switch its output.

Although conventional comparators with voltage hysteresis improve noise immunity for low-level noise in an input, unwanted switching may still occur as a result of transitory voltage spikes in the input. Moreover, some conventional comparators do not operate properly when the voltage of the input is near an upper rail (e.g., a supply voltage) or near a lower rail (e.g., a ground potential) of a common mode input voltage range.

In light of the above, a need exists for a comparator with increased noise immunity. A further need exists for a comparator with a rail-to-rail common mode input range.

SUMMARY

In various embodiments, a comparator includes a reference voltage generator that generates an upper reference voltage and a lower reference voltage based on an input reference voltage. A first comparator circuit generates a first comparison signal indicating whether an input signal is above the upper reference voltage. A second comparator circuit generates a second comparison signal indicating whether the input signal is below the lower reference voltage. The system further includes a latch that is set to a first state if the first comparison signal indicates the input signal is above the upper reference voltage. Moreover, the latch is set to a second state if the second control signal indicates the input signal is below the lower reference voltage. The latch maintains its state if the input signal is between the lower reference voltage and the upper reference voltage. In this way, the comparator has an amplitude hysteresis.

In further embodiments, each of the first and second comparator circuits has a rail-to-rail common mode input voltage range. In some embodiments, the first comparator circuit generates a third comparison signal indicating whether the input signal is higher than the upper reference voltage. The first comparator circuit low-pass filters the third comparison signal to generate the first comparison signal. The second comparator circuit generates a fourth comparison signal indicating whether the input signal is below the lower reference voltage. The second comparator circuit low-pass filters the fourth comparison signal to generate the second comparison signal. Low-pass filtering the third and fourth comparison signals filters out transitory voltage spikes above the upper reference voltage or below the lower reference voltage. In this way, the comparator circuits have a time hysteresis. In further embodiments, the amplitude hysteresis or the time hysteresis, or both, are selectable based on control inputs to the comparator.

In some embodiments, each of the comparator circuits is contained in an integrated circuit and includes a differential amplifier to compare the input signal to a reference voltage. The differential amplifier is self-biased to adjust for temperature, voltage, and process characteristics of the integrated circuit. In these embodiments, the differential amplifier generates a voltage to bias N-type transistors in the differential amplifier and another voltage to bias P-type transistors in the differential amplifier. Biasing the N-type transistors and P-type transistors with different bias voltages allows the differential amplifier to adjust for temperature, voltage, and process characteristics of the integrated circuit individually for the N-type and P-type transistors. Further, biasing the N-type transistors and the P-type transistors independently allows each comparator circuit to be configured into a low-power mode of operation by turning off both the N-type transistors and the P-type transistors in the comparator circuit.

A system, in accordance with one embodiment, includes a reference voltage generator, a first comparator circuit, a second comparator circuit, and a latch. The first comparator circuit and the second comparator circuit are each coupled to the reference voltage generator and to the latch. The reference voltage generator generates a first reference voltage and a second reference voltage based on an input reference voltage. The first reference voltage is higher than the second reference voltage. The first comparator circuit generates a first signal indicating whether an input signal is higher than the first reference voltage. The second comparator circuit generates a second signal indicating whether the input signal is lower than the second reference voltage. The latch is set to a first state if the first signal indicates the input signal is higher than the first reference voltage. Moreover, the latch is set to a second state if the second signal indicates the input signal is lower than the second reference voltage.

In a further embodiment, the first comparator circuit includes a first differential amplifier and a first low-pass filter. The first differential amplifier generates a third signal indicating whether the input signal is higher than the first reference voltage. The first low-pass filter performs a low-pass filtering of the third signal to generate the first signal. Further, the second comparator circuit includes a second differential amplifier and a second low-pass filter. The second differential amplifier generates a fourth signal indicating whether the input signal is lower than the second reference voltage. The second low-pass filter performs a low-pass filtering of the fourth signal to generate the second signal.

A method, in accordance with one embodiment, includes generating a first reference voltage and a second reference voltage based on an input reference voltage. The first reference voltage is higher than the second reference voltage. The method also includes generating a first signal indicating whether an input signal is higher than the first reference voltage and generating a second signal indicating whether the input signal is lower than the second reference voltage. The method further includes setting a latch to a first state if the first signal indicates the input signal is higher than the first reference voltage and setting the latch to a second state if the second signal indicates the input signal is lower than the second reference voltage.

In a further embodiment, the method generates the first signal by generating a third signal indicating whether the input signal is higher than the first reference voltage and low-pass filtering the third signal. Additionally, the method generates the second signal by generating a fourth signal indicating whether the input signal is lower than the second reference voltage and low-pass filtering the fourth signal.

A system, in accordance with one embodiment, includes a means for generating both a first reference voltage and a second reference voltage based on an input reference voltage. The first reference voltage is higher than the second reference voltage. The system also includes a means for generating a first signal indicating whether an input signal is higher than the first reference voltage and a means for generating a second signal indicating whether the input signal is lower than the second reference voltage. The system further includes a means for setting a latch to a first state if the first signal indicates the input signal is higher than the first reference voltage and a means for setting the latch to a second state if the second signal indicates the input signal is lower than the second reference voltage.

In a further embodiment, the system includes a means for generating a third signal indicating whether the input signal is higher than the first reference voltage and a means for low-pass filtering the third signal to generate the first signal. The system also includes a means for generating a fourth signal indicating whether the input signal is lower than the second reference voltage and a means for low-pass filtering the fourth signal to generate the second signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, a comparator has an amplitude hysteresis for comparing an input signal to an input reference voltage. Additionally, the comparator may have a time hysteresis for comparing the input signal to the input reference voltage. The amplitude hysteresis and the time hysteresis may be selectable based on one or more control signals. In some embodiments, the comparator has a rail-to-rail-common mode input range. In further embodiments, the comparator is implemented in an integrated circuit and is self-biased for adjusting to temperature, voltage, and process characteristics of the integrated circuit. Moreover, the comparator generates a bias voltage for biasing N-type transistors and another bias voltage for biasing P-type transistors. In this way, the N-type transistors are biased independently from the P-type transistors, which improves performance of the comparator.

Figure 1:
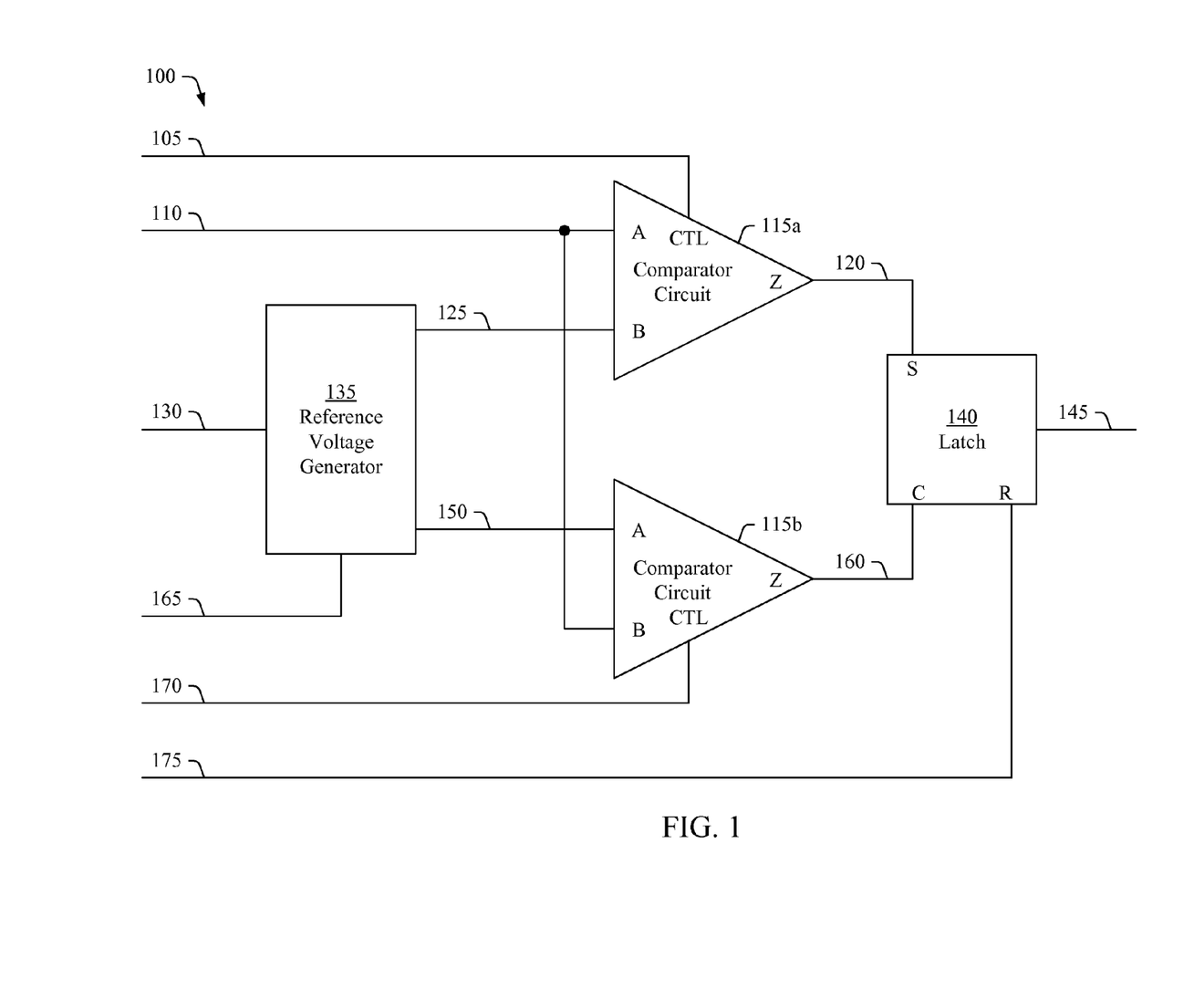
FIG. 1 is a block diagram of a comparator, in accordance with an embodiment of the present invention.

FIG. 1 illustrates a comparator 100, in accordance with an embodiment of the present invention. The comparator 100 includes two comparator circuits 115 (e.g., comparator circuits 115a and 115b), a reference voltage generator 135, and a latch 140. Each of the comparator circuits 115 is coupled to the reference voltage generator 135 and the latch 140. The reference voltage generator 135 receives an input reference voltage 130 and generates an upper reference voltage 125 and a lower reference voltage 150. The upper reference voltage 125 is higher than the lower reference voltage 150. The comparator circuit 115a receives an input signal 110 at an input A of the comparator circuit 115a and the upper reference voltage 125 at an input B of the comparator circuit 115a. The comparator circuit 115a generates a comparison signal 120 at an output Z of the comparator circuit 115a indicating whether the input signal 110 is above the upper reference voltage 125. The comparator circuit 115b receives the lower reference voltage 150 at an input A of the comparator circuit 115b and the input signal 110 at an input B of the comparator circuit 115b. The comparator circuit 115b generates a comparison signal 160 at an output Z of the comparator circuit 115b indicating whether the input signal 110 is below the lower reference voltage 150. The latch 140 receives the comparison signal 120 at a set input S and receives the comparison signal 160 at a clear input C. If the comparison signal 120 indicates the input signal 110 is above the upper reference voltage 125, the latch 140 sets to a first state in response to the comparison signal 120 and generates an output signal 145 indicating the first state. For example, the latch 140 may output a voltage representing a logic value of one when the latch 140 is set to the first state. If the comparison signal 160 indicates the input signal 110 is below the lower reference voltage 150, the latch 140 sets to a second state in response to the comparison signal 160 and generates the output signal 145 indicating the second state. For example, the latch 140 may output a voltage representing a logic value of zero when the latch 140 is set to the second state. If the input signal 110 is between the lower reference voltage 150 and the upper reference voltage 125, the latch 140 maintains its current state. In this way, the comparator 100 has an amplitude hysteresis.

The reference voltage generator 135 may be any circuit or device for generating the upper reference voltage 125 and the lower reference voltage 150. In one embodiment, the reference voltage generator 135 generates a first voltage offset and a second voltage offset. In this embodiment, the upper reference voltage 125 is the sum of the input reference voltage 130 and the first voltage offset. The lower reference voltage 150 is the difference between the input reference voltage 130 and the second voltage offset. In a further embodiment, the reference voltage generator 135 receives a control signal 165 and selects the upper reference voltage 125 and the lower reference voltage 150 based on the control signal 165.

The comparator circuit 115 may be any circuit or device for comparing two inputs and generating an output indicating which input has a higher voltage. For example, the comparator circuit 115 may be an operational amplifier or a differential amplifier. In various embodiments, the comparator circuit 115 filters out voltage transitions (e.g., voltage spikes) from the input signal 110 having a duration less than a defined pulse width. For example, the comparator circuit 115 may filter out any voltage transitions in the input signal 110 having a duration of less than ten picoseconds. In this way, the comparator circuit 115 has a time hysteresis.

In one embodiment, the pulse width is predefined by the comparator circuit 115. In another embodiment, the comparator circuit 115 includes a control input CTL for receiving a control signal. As illustrated in FIG. 1, the comparator circuit 115a has a control input CTL for receiving a control signal 105 and the comparator circuit 115b has a control input CTL for receiving a control signal 170. Each of the control signals 105 and 170 may include multiple signals for controlling operation of the respective comparator circuits 115a and 115b. For example, each of the control signals 105 and 170 may be a control bus. The comparator circuit 115a selects a pulse width based on the control signal 105, and the comparator circuit 115b selects a pulse width based on the control signal 170. In this way, each of the comparator circuits 115a and 115b can individually select a pulse width for filtering out voltage transitions from the input signal 110. In one embodiment, the comparator circuits 115a and 115b receive the same control signal 105 or 170 at their respective control inputs CTL. In this embodiment, the control signal 105 or 170 selects the same pulse width for both of the comparator circuits 115a and 115b.

In further embodiments, the comparator circuit 115 may operate in a normal mode of operation or a low-power mode of operation. In these embodiments, the control input CTL of the comparator circuit 115 is used to set the comparator circuit 115 to the normal mode of operation or the low-power mode of operation, as is described more fully herein. The comparator circuit 115a is set in the normal mode of operation or the low-power mode of operation based on the control signal 105. The comparator circuit 115b is set in the normal mode of operation or the low-power mode of operation based on the control signal 170. In one embodiment, the comparator circuits 115a and 115b receive the same control signal 105 or 170 at their respective control inputs C. In this embodiment, the control signal 105 or 170 may set the comparator circuits 115a and 115b in the normal mode of operation or the low-power mode of operation.

The latch 140 may be any type of latch that can be set to one state in response to an input signal and to another state in response to another input signal. In one embodiment, the latch 140 is a set-reset (SR) latch. In a further embodiment, the latch 140 includes a reset input R that receives a reset signal 175. The reset signal 175 indicates whether the latch 140 is to be reset. If the reset signal 175 indicates that the latch 140 is to be reset, the latch 140 is set to the second state regardless of the comparison signals 120 and 160. For example, the reset signal 175 may be asserted to indicate that the latch 140 is to be reset and deasserted to indicate the latch 140 is not to be reset. In this example, the latch 140 is reset when the reset signal 175 is asserted.

Figure 2:
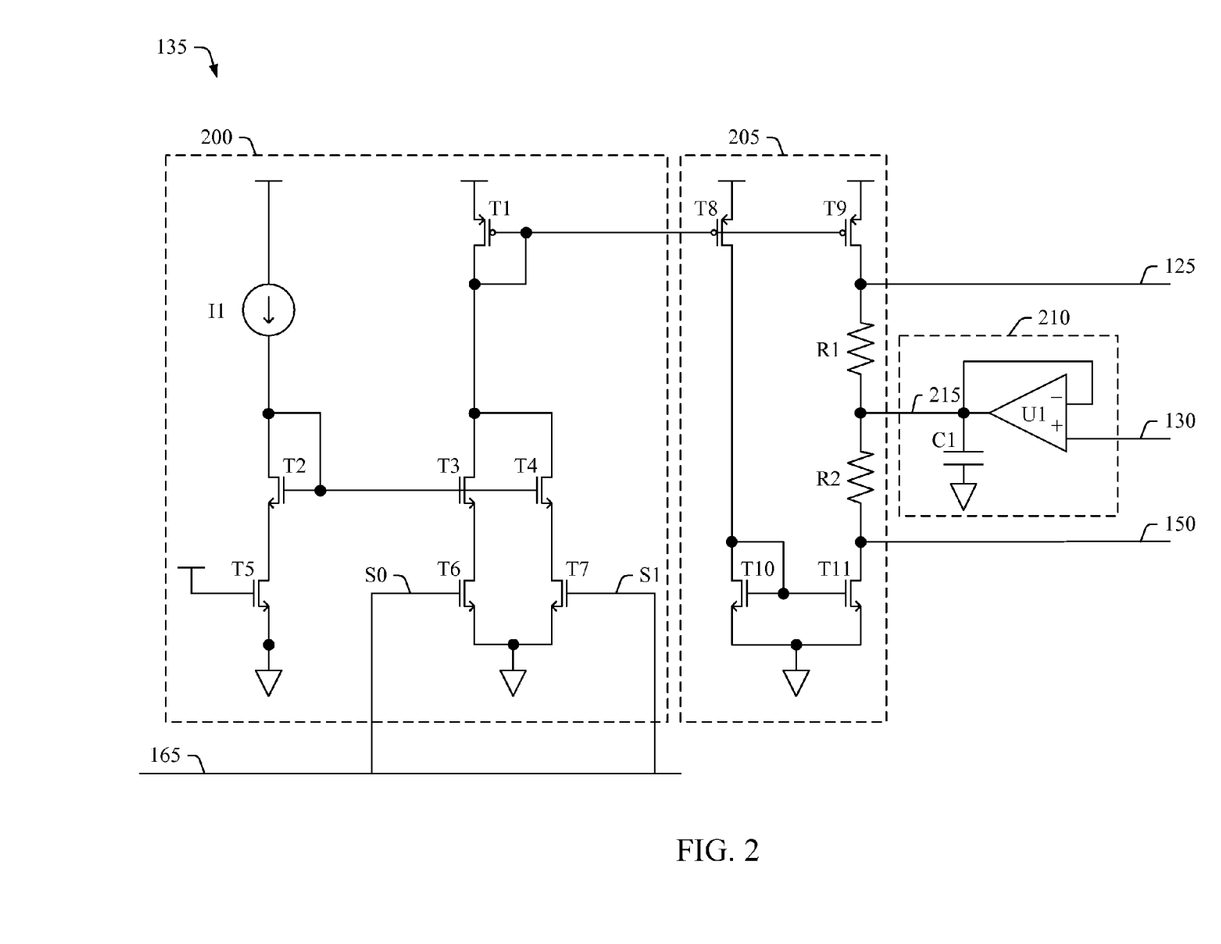
FIG. 2 is a schematic diagram of a reference voltage generator, in accordance with an embodiment of the present invention.

FIG. 2 illustrates the reference voltage generator 135, in accordance with an embodiment of the present invention. The reference voltage generator 135 includes a current mirror 200, a voltage divider 205, and a voltage generator 210. The current mirror 200 includes a current source I1 and transistors T1-T7. The transistors T1-T7 may be Metal-Oxide-Semiconductor (MOS) transistors. For example, the transistor T1 may be a P-type transistor, such as a P-type Metal-Oxide-Semiconductor (PMOS) transistor, and each of the transistors T2-T7 may be an N-type transistor, such as an N-type Metal-Oxide-Semiconductor (NMOS) transistor. The current source I1 may include a reference voltage generator that generates a substantially constant reference voltage across temperature, voltage, and process characteristics of an integrated circuit. For example, the current source I1 may generate a current by applying a bandgap voltage across a resistor in the integrated circuit.

One end of the current source I1 is connected to a supply voltage (e.g., Vdd) and the other end of the current source I1 is connected to a drain of the transistor T2. The current source I1 generates a current that flows into the drain of the transistor T2. For example, the current generated by the current source I1 may be 50 microamps. The drain of the transistor T2 is also connected a gate of the transistor T2. A source of the transistor T2 is connected to a drain of transistor T5. A gate of the transistor T5 is connected to the supply voltage, and a source of the transistor T5 is connected to a ground potential (e.g., Vss). In various embodiments, the sizes of the transistors T2 and T5 are selected based on the sizes of the transistors T3, T4, T6, and T7 such that the currents flowing into the drains of the transistors T2, T3, and T4 mirror each other, as is described more fully herein.

A source of the transistor T1 is connected to the supply voltage, and a gate of the transistor T1 is connected to a drain of the transistor T1. The drain of the transistor T1 is also connected to a drain of the transistor T3 and a drain of the transistor T4. A gate of the transistor T3 and a gate of the transistor T4 are each connected to the gate of the transistor T2. A source of the transistor T3 is connected to a drain of the transistor T6, and a source of the transistor T4 is connected to a drain of the transistor T7. A source of the transistor T6 and a source of the transistor T7 are each connected to a ground potential. Further, the control signal 165 includes a control signal S0 and a control signal S1. A gate of the transistor T6 receives the control signal S0, and a gate of the transistor T7 receives the control signal S1.

The control signals S0 and S1 control the respective transistors T6 and T7 by turning the transistors T6 and T7 on or off. In various embodiments, the control signals S0 and S1 turn on one or both of the transistors T6 and T7, which determines a current flowing from the drain of the transistor T1 into the drains of the transistors T3 and T4. In one embodiment, the transistor T3 has the same size (e.g., the same length and width) as the transistor T2, and the transistor T6 has the same size as the transistor T5. Further, the transistor T4 is half the size of the transistor T2 and the transistor T7 is half the size of the transistor T5.

If the control signal S0 turns on the transistor T6 and the control signal S1 turns off the transistor T7, the current flowing from the drain of the transistor T1 into the drains of the transistors T3 and T4 is the same as the current flowing from the current source I1 into the drain of the transistor T2. If the control signal S0 turns off transistor T6 and the control signal S1 turns on the transistor T7, the current flowing from the drain of the transistor T1 into the drains of the transistors T3 and T4 is half the current flowing from the current source I1 into the drain of transistor T2. If the control signal S0 turns on the transistor T6 and the control signal S1 turns on the transistor T7, the current flowing from the drain of the transistor T1 into the drains of the transistors T3 and T4 is one-and-a-half times the current flowing from the current source I1 into the drain of the transistor T2. In other embodiments, the transistors T2-T7 may have other sizes and ratios. Moreover, the current mirror 200 may have more or fewer transistors T3, T4, T6, and T7 and more or fewer control signals S0 and S1 for selecting the current flowing from the drain of the transistor T1.

The voltage divider 205 includes transistors T8-T11 and resistors R1 and R2. The transistors T8-T11 may be MOS transistors. For example, each of the transistors T8 and T9 may be a P-type transistor, such as a PMOS transistor, and each of the transistors T10-T11 may be an N-type transistor, such as an NMOS transistor.

A source of the transistor T8 and a source of the transistor T9 are each connected to the supply voltage. Further, a gate of the transistor T8 and a gate of the transistor T9 are each connected to the gate of the transistor T1. In this way, the current flowing from each drain of the transistors T8 and T9 is mirrored to the current flowing from the drain of the transistor T1. In one embodiment, the transistors T1, T8, and T9 have the same size (e.g., the same length and width) such that the current flowing from each drain of the transistors T8 and T9 is the same as the current flowing from the drain of the transistor T1. In other embodiments, the transistors T1, T8, and T9 may have other sizes.

The drain of the transistor T8 is connected to a drain of the transistor T10. Further, the drain of the transistor T10 is connected to a gate of the transistor T10. A source of the transistor T10 is connected to a ground potential. A drain of the transistor T9 is connected to one end of the resistor R1. The other end of the resistor R1 is connected to one end of the resistor R2 at a junction between the resistors R1 and R2. The other end of the resistor R2 is connected to a drain of the transistor T11. A gate of the transistor T11 is connected to the gate of the transistor T10. A source of the transistor T11 is connected to a ground potential. The current flowing from the drain of the transistor T9 flows through the resistors R1 and R2 and generates a voltage offset across each of the resistors R1 and R2 with respect to the junction between the resistors R1 and R2. In this way, the resistors R1 and R2 divide a voltage between the drain of the transistor T9 and the drain of the transistor T11. The resistors R1 and R2 may have the same resistance or difference resistances. For example, each of the resistors R1 and R2 may have a resistance of two-thousand ohms.

The voltage generator 210 includes an operational amplifier U1 and a capacitor C1. A positive input of the operational amplifier U1 receives the input reference voltage 130. An output of the operational amplifier U1 is connected to a negative input of the operational amplifier U1. In this way, the operational amplifier U1 is configured as a voltage follower. The operational amplifier U1 generates an output reference voltage 215 at the junction between the resistors R1 and R2 that is substantially the same as the input reference voltage 130. The capacitor C1 is connected between an output of the operational amplifier U1 and a ground potential. The capacitor C1 functions as a low-pass filter to filter out noise in the output reference voltage 215 generated by the operational amplifier U1.

In this embodiment, the upper reference voltage 125 is the sum of the output reference voltage 215 and the voltage offset across the resistor R1. The lower reference voltage 150 is the difference between the output reference voltage 215 and the voltage offset across the resistor R2. Moreover, the amplitude hysteresis of the comparator 100 is the voltage difference between the upper reference voltage 125 and the lower reference voltage 150.

Figure 3:
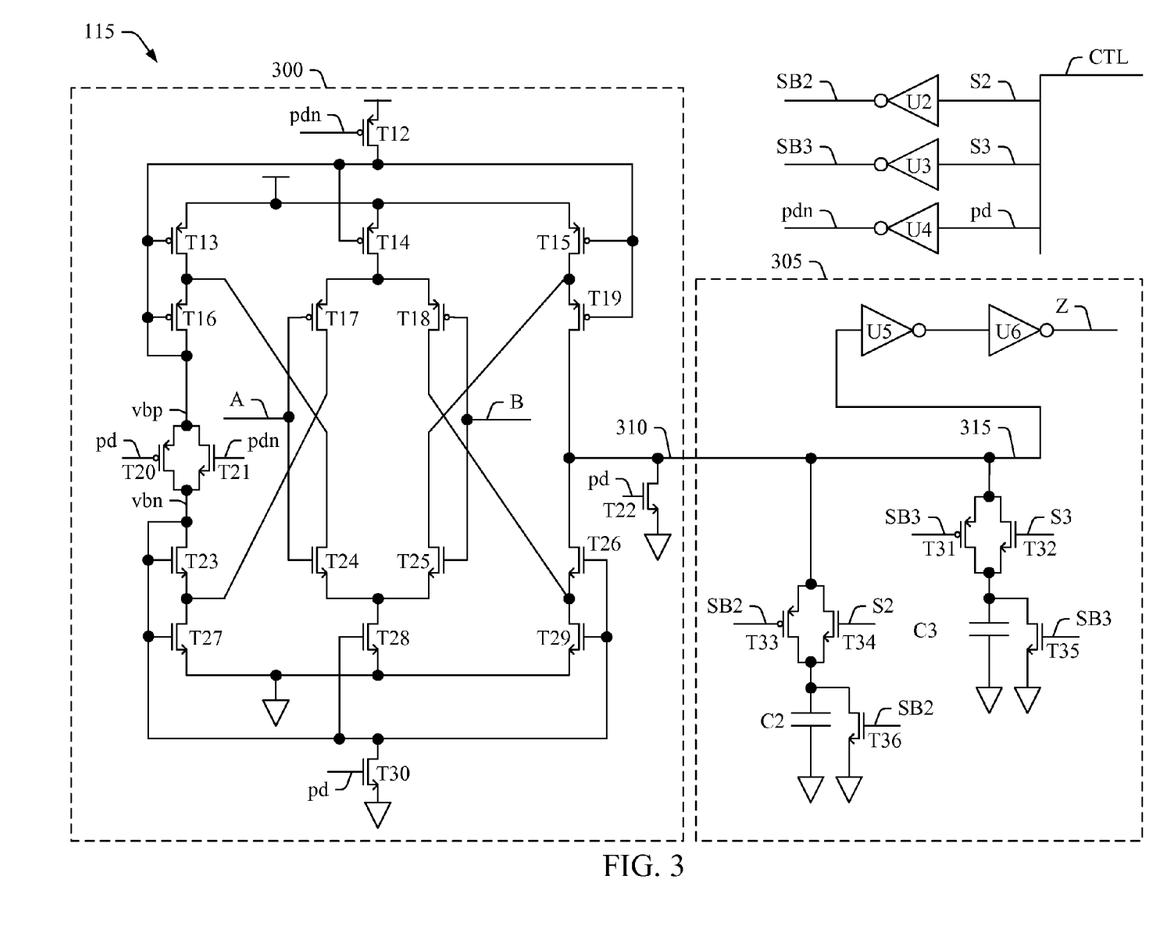
FIG. 3 is a schematic diagram of a comparator circuit, in accordance with an embodiment of the present invention.

FIG. 3 illustrates the comparator circuit 115, in accordance with an embodiment of the present invention. The comparator circuit 115 includes a differential amplifier 300 and a low-pass filter 305. The differential amplifier 300 generates a comparison signal 310 indicating whether a voltage at the input A of the comparator circuit 115 (e.g., the input signal 110 or the lower reference voltage 150) is higher than a voltage at the input B of the comparator circuit 115 (e.g., the upper reference voltage 125 or the input signal 110). The low-pass filter 305 passes lower frequency components of the comparison signal 310 and filters out higher frequency components of the comparison signal 310 to generate an output signal (e.g., the comparison signal 120 or 160) at the output Z of the comparator circuit 115. By filtering out the higher frequency components of the comparison signal 310, the low-pass filter 305 filters out transitory voltages having a short duration, for example less than ten picoseconds. As illustrated, the control input CTL of the comparator circuit 115 receives a control signal (e.g. control signal 105 or 170), which includes a control signal S2, a control signal S3, and a control signal pd. In other embodiments, the control signal received at the control input CTL of the comparator circuit 115 may include more or fewer control signals.

In one embodiment, the comparator circuit 115 includes three inverters U2-U4. The inverter U2 inverts the control signal S2 to generate a control signal SB2. The inverter U3 inverts the control signal S3 to generate a control signal SB3. The inverter U4 inverts the control signal pd to generate the control signal pdn. In some embodiments, one or more of the inverters U2-U4 are optional. In these embodiments, the control signal received at the control input CTL of the comparator circuit 115 may include one or more of the control signals SB2, SB3, or pdn in addition to the control signals S2, S3, and pd.

In one embodiment, the differential amplifier 300 includes transistors T12-T30. The transistors T12-T20 may be P-type transistors, such as PMOS transistors, and the transistors T21-T30 may be N-type transistors, such NMOS transistors. The transistors T17 and T18 are a differential pair of transistors, and the transistors T24 and T25 are a differential pair of transistors. A gate of the transistor T17 and a gate of the transistor T24 are each connected to the input A of the comparator circuit 115 and each receives an input signal (e.g., input signal 110 or lower reference voltage 150) at the input A. A gate of the transistor T18 and a gate of the transistor T25 are each connected to the input B of the comparator circuit 115 and each receives an input signal (e.g., the upper reference voltage 125 or the input signal 110) at the input B.

A source of the transistor T17 is connected to a source of the transistor T18 and a source of the transistor T24 is connected to a source of the transistor T25. A drain of the transistor T17 is connected to a source of the transistor T23, and a drain of the transistor T24 is connected to a source of the transistor T16. Additionally, a drain of the transistor T16 is connected to a gate of the transistor T16, a gate of the transistor T13, a gate of the transistor T14, a gate of the transistor T15, and a gate of the transistor T19. The transistor T16 generates a bias voltage vbp at its drain that biases the gate of the transistor T16, the gate of the transistor T13, the gate of the transistor T14, the gate of the transistor T15, and the gate of the transistor T19. In this way, the transistors T13, T14, T15, T16, and T19 are self-biased.

A drain of the transistor T23 is connected to a gate of the transistor T23, a gate of the transistor T27, a gate of the transistor T28, a gate of the transistor T29, and a gate of the transistor T26. The transistor T23 generates a bias voltage vbn at its drain that biases the gate of the transistor T23, the gate of the transistor T27, the gate of the transistor T28, the gate of the transistor T29, and the gate of the transistor T26. In this way, the transistors T23, T26, T27, T28, and T29 are self-biased.

The drain of the transistor T16 is connected to a source of the transistor T20 and a drain of the transistor T21, and the drain of the transistor T23 is connected to a drain of the transistor T20 and a source of the transistor T21. In this way, the transistors T20 and T21 form a transmission gate between the drain of the transistor T16 and the drain of the transistor T23. Moreover, the transmission gate separates the bias voltage vbp at the drain of the transistor T16 from the bias voltage vbn at the drain of the transistor T23. A gate of the transistor T20 receives the control signal pd for controlling operation of the transistor T20, and a gate of the transistor T21 receives the control signal pdn for controlling operation of the transistor T21. Moreover, the combination of control signals pd and pdn controls operation of the transmission gate containing the transistors T20 and T21.

A drain of the transistor T18 is connected to a source of the transistor T26, and a drain of the transistor T25 is connected to a source of the transistor T19. Additionally, a drain of the transistor T19 is connected to a drain of the transistor T26. The comparison signal 310 is generated at a junction between the drain of the transistor T19 and the drain of the transistor T26. Further, a drain of the transistor T22 is connected to the drain of the transistor T19 and the drain of the transistor T26. A source of the transistor T22 is connected to a ground potential. A gate of the transistor T22 receives the control signal pd for controlling operation of the transistor T22.

A source of the transistor T12 is connected to the supply voltage. A gate of the transistor T12 receives the control signal pdn for controlling operation of the transistor T12. A drain of the transistor T12 is connected to the gate of the transistor T13, the gate of the transistor T14, the gate of the transistor T15, the gate of the transistor T16, and the gate of the transistor T19. A source of each of the transistors T13, T14, and T15 is connected to the supply voltage. A drain of the transistor T13 is connected to the source of the transistor T16 and the drain of the transistor T24. A drain of the transistor T14 is connected to the source of each transistor T17 and T18. A drain of the transistor T15 is connected to the source of the transistor T19 and the drain of the transistor T25.

A source of the transistor T30 is connected to a ground potential. A gate of the transistor T30 receives the control signal pd for controlling operation of the transistor T30. A drain of the transistor T30 is connected to the gate of the transistor T23, the gate of the transistor T26, the gate of the transistor T27, the gate of the transistor T28, the gate of the transistor T29, and the gate of the transistor T26. A source of each of the transistors T27, T28, and T29 is connected to a ground potential. A drain of the transistor T27 is connected to the source of the transistor T23 and the drain of the transistor T17. A drain of the transistor T28 is connected to the source of the transistor T24 and the source of the transistor T25. A drain of the transistor T29 is connected to the source of the transistor T26 and the drain of the transistor T18.

In the normal mode of operation, the differential amplifier 300 receives a signal (e.g., the input signal 110 or the lower reference voltage 150) at the input A and another signal (e.g., the upper reference voltage 125 or the input signal 110) at the input B. In turn, the differential amplifier 300 generates the comparison signal 310 indicating whether the voltage at the input A is greater than the voltage at the input B. The comparison signal 310 has a higher voltage when the signal at the input A is higher than the signal at the input B and a lower voltage when the signal at the input B is higher than the signal at the input A. In this way, the comparison signal 310 indicates whether the signal at the input A is higher than the signal at the input B.

In various embodiments, the differential amplifier 300 has a rail-to-rail common mode input range, which ranges from a ground potential (e.g. Vss) to the supply voltage (e.g. Vdd). For discussion purposes, the rail-to-rail common mode input range may be divided into three voltage ranges. A first voltage range of the rail-to-rail common mode input range extends from the ground potential (e.g., Vss) to a threshold voltage Vtn of the transistors T24 and T25 (e.g., Vss+Vtn). The threshold voltage Vtn of the transistors T24 and T25 may be in a range of 0.2 volts to 0.6 volts. For example, the threshold voltage Vtn of the transistors T24 and T25 may be 0.4 volts. In the first voltage range, the differential pair of transistors T17 and T18 are operational (e.g., turned on) and the differential pair of transistors T24 and T25 are not operational (e.g., turned off).

A second voltage range of the rail-to-rail common mode input range extends from the voltage threshold Vtn of the transistors T24 and T25 to a voltage threshold Vtp of the transistors T17 and T18 below the supply voltage (e.g., Vdd−Vtp). The supply voltage may be 1.2 volts and the voltage threshold Vtp of the transistors T17 and T18 may in a range of 0.2 volts to 0.6 volts. For example, the threshold voltage of the transistors T17 and T18 may be 0.4 volts. In the second voltage range, the differential pair of transistors T17 and T18 are operational (e.g., turned on) and the differential pair of transistors T24 and T25 are operational (e.g., turned on).

A third voltage range of the rail-to-rail common mode input range extends from the threshold Vtp of the transistors T17 and T18 below the supply voltage (e.g., Vdd−Vtp) to the supply voltage. In the third voltage range, the differential pair of transistors T17 and T18 are not operational (e.g., turned off) and the differential pair of transistors T24 and T25 are operational (e.g., turned on). Thus, the differential pair T17 and T18 or the differential pair T24 and T25, or both, are operational from the ground potential (e.g., Vss) to the supply voltage (Vdd) in each of the first, second, and third voltage ranges. In this way, the differential amplifier 300 has a rail-to-rail common mode input range.

In the normal mode of operation, the control signal pd turns on the transistor T20 and the control signal pdn turns on the transistor T21. Thus, the transmission gate including the transistors T20 and T21 is turned on and has a low resistance. Moreover, the voltage across the transmission gate is the difference in the bias voltages vbp and vbn. Also in the normal mode of operation, the control signal pdn turns off the transistor T12, and the control signal pd turns off the transistors T22 and T30. The transistor T12 does not substantially affect the voltage at the gates of the transistors T13, T14, T15, T16, and T19 because the transistor T12 is turned off. The transistor T30 does not substantially affect the voltage at the gates of the transistors T23, T26, T27, T28, and T29 because the transistor T30 is turned off. Further, the transistor T22 does not substantially affect the comparison signal 310 because the transistor T22 is turned off.

In the low-power mode of operation, the control signal pd turns off the transistor T20 and the control signal pdn turns off the transistor T21. Thus, the transmission gate including the transistors T20 and T21 is turned off and has a high resistance. Further, the control signal pdn turns on the transistor T12 and the control signal pd turns on the transistors T22 and T30. Because the transistor T12 is on, the bias voltage vbp is pulled up to the supply voltage. Because the bias voltage vbp is pulled up to the supply voltage, the transistors T13, T14, T15, T16, and T19 are turned off. The bias voltage vbn is pulled down to a ground potential because the transistor T30 is on. Because the bias voltage vbn is pulled down to the ground potential, the transistors T23, T26, T27, T28, and T29 are turned off.

In the low-power mode of operation, the voltage across the transmission gate including the transistors T20 and T21 is the supply voltage. Because the transmission gate has a high resistance in the low-power mode of operation, the current flowing through the transmission gate is substantially less than the current flowing through the transmission gate in the normal mode of operation. Additionally, the comparison signal 310 is pulled down to a ground potential because the transistor T22 is turned on. In this way, the comparison signal 310 does not drift (e.g., float) between the supply voltage and a ground potential, which may cause power to be consumed in other transistors or components of the comparator circuit 115.

The low-pass filter 305 receives the comparison signal 310 from the differential amplifier 300 and generates a comparison signal 315. Further, the low-pass filter 305 can perform a low-pass filtering on the comparison signal 310 to generate the comparison signal 315 based on the control signals S2, SB2, S3, and SB3. The low-pass filter 305 includes transistors T31-T36 and capacitors C2 and C3. Additionally, the low-pass filter 305 may optionally include inverters U5 and U6. A source of the transistor T31, a drain of the transistor T32, a source of the transistor T33, and a drain of the transistor T34 are connected to each other and to the drain of the transistor T19, the drain of the transistor T22, and the drain of the transistor T26. The comparison signal 315 is generated at a junction between the source of the transistor T31 and the drain of the transistor T32.

A gate of the transistor T33 receives the control signal SB2 and a gate of the transistor T34 receives the control signal S2. A drain of the transistor T33 and a source of the transistor T34 are each connected to one end of the capacitor C2 and a drain of the transistor T36. The other end of the capacitor C2 is connected to a ground potential. A gate of the transistor T36 receives the control signal SB2 and a source of the transistor T36 is connected to a ground potential. In one configuration, the control signal S2 turns on the transistor T34, and the control signal SB2 turns on the transistor T33 and turns off the transistor T36. In this configuration, the transistors T33 and T34 in combination with the capacitor C2 function as a low-pass filter having a capacitance that is substantially the same as a capacitance of the capacitor C2.

In another configuration, the control signal S2 turns off the transistor T34, and the control signal SB2 turns off the transistor T33 and turns on the transistor T36. In this configuration, the transistor T36 functions as a short circuit across the capacitor C2, and the transistors T33 and T34 function as a transmission gate having a high resistance. As a result, the capacitor C2 and the transistors T33, T34, and T36 do not substantially affect the comparison signal 310. Stated differently, the capacitor C2 and the transistors T33, T34, and T36 do not perform a low-pass filtering on the comparison signal 310 in this configuration.

A gate of the transistor T31 receives the control signal SB3 and a gate of the transistor T32 receives the control signal S3. A drain of the transistor T31 and a source of the transistor T32 are each connected to one end of a capacitor C3 and a drain of a transistor T35. The other end of the capacitor C3 is connected to a ground potential. A gate of the transistor T35 receives the control signal SB3 and a source of the transistor T35 is connected to a ground potential. In one configuration, the control signal S3 turns on the transistor T32, and the control signal SB3 turns on the transistor T31 and turns off the transistor T35. In this configuration, transistors T31 and T32 in combination with the capacitor C3 function as a low-pass filter having a capacitance that is substantially the same as a capacitance of the capacitor C3.

In another configuration, the control signals S3 turns off the transistor T32, and the control signal SB3 turns off the transistor T31 and turns on the transistor T35. In this configuration, the transistor T35 functions as a short circuit across the capacitor C3, and the transistors T31 and T32 function as a transmission gate having a high resistance. As a result, the capacitor C3 and the transistors T31, T32, and T35 do not substantially affect the comparison signal 310. Stated differently, the capacitor C3 and the transistors T31, T32, and T35 do not perform a low-pass filtering on the comparison signal 310 in this configuration.

The capacitance of the low-pass filter 305 is based on the controls signals S2 and S3. Depending upon these control signals S2 and S3, the capacitance of the low-pass filter 305 may be substantially zero, the capacitance of capacitor C2, the capacitance of capacitor C3, or the sum of the capacitances of capacitors C2 and C3. The capacitance of the low-pass filter 305 determines the pulse width of a transitory voltage (e.g., voltage spikes) in the comparison signal 310 that is filtered out by the low-pass filter 305. Generally, the pulse width filtered out by the low-pass filter 305 becomes larger as the capacitance of the low-pass filter 305 increases. Moreover, the capacitance of the low-pass filter 305 determines a time hysteresis of the comparator circuit 115, which is selectable based on the control signal S2 and S3. In other embodiments, the low-pass filter 305 may have more or fewer transistors T31-T36, more or fewer capacitors C2 and C3, and more or fewer controls signals S2 and S3 for selecting the capacitance of the low-pass filter 305.

In embodiments without the inverters U5 and U6, the junction between the source of the transistor T31 and the drain of the transistor T32 is the output Z of the comparator circuit 115. In these embodiments, the comparator circuit 115 outputs the comparison signal 315 at the output Z of the comparator circuit 115. For example, the comparison signal may be the comparison signal 120 or the comparison signal 160.

In embodiments including the inverters U5 and U6, the source of the transistor T31 and the drain of the transistor T32 are each connected to an input of the inverter U5. The output of the inverter U5 is connected to the input of the inverter U6, and the output of the inverter U6 is the output Z of the comparator circuit 115. The inverter U5 receives the comparison signal 315 at its input, inverts the comparison signal 315, and provides the inverted comparison signal 315 to the input of the inverter U6. The inverter U6 receives the inverted comparison signal 315 at its input and inverts the inverted comparison signal 315 to generate an output signal (e.g., the comparison signal 120 or 160) at the output Z of the comparator circuit 115. The inverters U5 and U6 buffer the comparison signal 315 and may increase the noise immunity of the comparator circuit 115.

Figure 4:
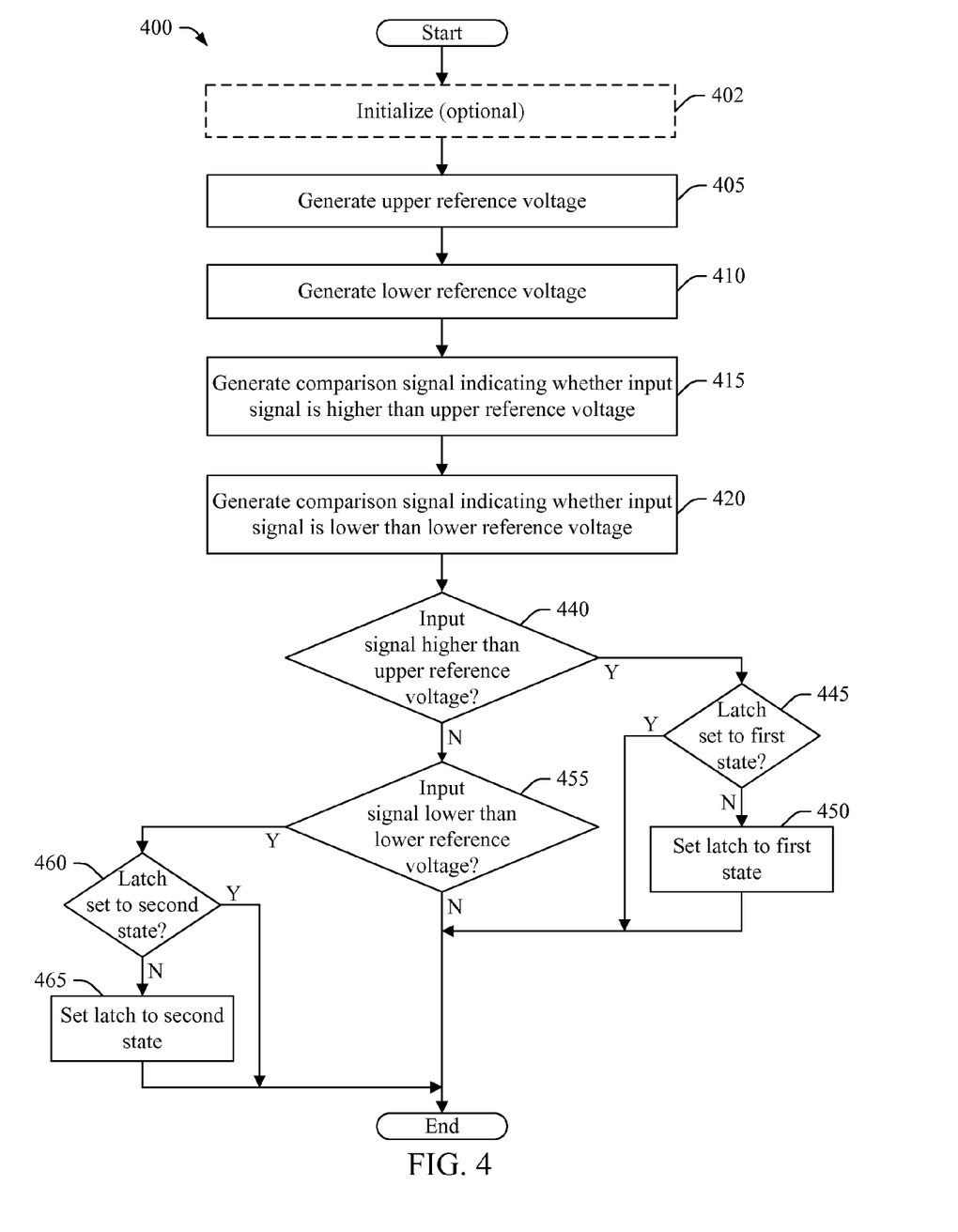
FIG. 4 is a flow chart for a method of comparing an input signal to an input reference voltage, in accordance with an embodiment of the present invention.

FIG. 4 illustrates a method 400 of comparing the input signal 110 to the input reference voltage 130, in accordance with an embodiment of the present invention. In optional step 402, the comparator 100 is initialized. In this process, the latch 140 may be reset in response to a reset signal 175. The latch 140 may be reset by setting the latch 140 to a second state. For example, the latch 140 may output a voltage representing a logic value of zero in the second state. The method 400 then proceeds to step 405.

In step 405, the reference voltage generator 135 generates the upper reference voltage 125. In one embodiment, the upper reference voltage 125 is based on the input reference voltage 130 and is higher than the input reference voltage 130. In a further embodiment, the upper reference voltage 125 is also based on the control signal 165. In this embodiment, the reference voltage generator 135 selects a voltage offset based on the control signal 165, and the upper reference voltage 125 is the sum of the input reference voltage 130 and the voltage offset. The method 400 then proceeds to step 410.

In step 410, the reference voltage generator 135 generates the lower reference voltage 150. In one embodiment, the lower reference voltage 150 is based on the input reference voltage 130 and is lower than the input reference voltage 130. In a further embodiment, the lower reference voltage 150 is also based on the control signal 165. In this embodiment, the reference voltage generator 135 selects a voltage offset based on the control signal 165 and the lower reference voltage 150 is the difference between the input reference voltage 130 and the voltage offset. The method 400 then proceeds to step 415.

In step 415, the comparator circuit 115a generates the comparison signal 120 indicating whether the input signal 110 is higher than the upper reference voltage 125. The input signal 110 is higher than the upper reference voltage 125 if a voltage of the input signal 110 is higher than the upper reference voltage 125. In one embodiment, the comparator circuit 115a generates an intermediate comparison signal (e.g., the comparison signal 310) indicating whether the input signal 110 is higher than the upper reference voltage 125 and low-pass filters the intermediate comparison signal to generate the comparison signal 120. The method 400 then proceeds to step 420.

In step 420, the comparator circuit 115b generates the comparison signal 160 indicating whether the input signal 110 is lower than the lower reference voltage 150. The input signal 110 is lower than the lower reference voltage 150 if a voltage of the input signal 110 is lower than the lower reference voltage 150. In one embodiment, the comparator circuit 115b generates an intermediate comparison signal (e.g., the comparison signal 310) indicating whether the input signal 110 is lower than the lower reference voltage 150 and low-pass filters the intermediate comparison signal to generate the comparison signal 160. The method 400 then proceeds to step 440.

In step 440, the latch 140 determines whether the input signal 110 is higher than the upper reference voltage 125 based on the comparison signal 120. If the latch 140 determines the input signal 110 is higher than the upper reference voltage 125, the method 400 proceeds to step 445, otherwise the method 400 proceeds to step 455.

In step 445, arrived at from the determination in step 440 that the input signal 110 is higher than the upper reference voltage 125, the latch 140 determines whether it is set to the first state. For example, the latch 140 may output a voltage representing a logical value of one in the first state. If the latch 140 is not set to the first state, the method 400 proceeds to step 450, otherwise the method 400 ends. In an alternative embodiment, the method 400 returns to step 405 if the latch 140 is set to the first state.

In step 450, arrived at from the determination in step 445 that the latch 140 is not set to the first state, the latch 140 is set to the first state. The method 400 then ends. In an alternative embodiment, the method 400 returns to step 405.

In step 455, arrived at from the determination in step 440 that the input signal 110 is not higher than the upper reference voltage 125, the latch 140 determines whether the input signal 110 is lower than the lower reference voltage 150 based on the comparison signal 160. If the latch 140 determines the input signal 110 is lower than the lower reference voltage 150, the method 400 proceeds to step 460, otherwise the method 400 ends. In an alternative embodiment, the method 400 returns to step 405 if the latch 140 determines the input signal 110 is not lower than the lower reference voltage 150.

In step 460, arrived at from the determination in step 455 that the input signal 110 is less than the lower reference voltage 150, the latch 140 determines whether it is set to the second state. If the latch 140 is not in the second state, the method 400 proceeds to step 465, otherwise the method 400 ends. In an alternative embodiment, the method 400 returns to step 405 if the latch 140 is in the second state.

In step 465, arrived at from the determination in step 460 that the latch 140 is not set to the second state, the latch 140 is set to the second state. The method 400 then ends. In an alternative embodiment, the method 400 returns to step 405.

In various embodiments, the steps 402-465 of the method 400 may be performed in a different order than illustrated in FIG. 4. For example, the step 405 may be performed before the step 410. In some embodiments, various steps 402-465 may be performed in parallel. For example, steps 405 and 410 may be performed in parallel, steps 415 and 420 may be performed in parallel, and steps 440-465 may be performed in parallel. In some embodiments, various steps 402-465 may be performed at substantially the same time. For example, steps 405 and 410 may be performed substantially simultaneously, steps 415 and 420 may be performed substantially simultaneously, and steps 440-465 may be performed substantially simultaneously.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A system comprising:
 a reference voltage generator configured to generate a first reference voltage based on an input reference voltage and a second reference voltage based on the input reference voltage, the first reference voltage being higher than the second reference voltage, the reference voltage generator further configured to select the first reference voltage and the second reference voltage based on a first control input, wherein the first reference voltage and the second reference voltage define an amplitude hysteresis, the amplitude hysteresis being a voltage difference between the first reference voltage and the second reference voltage;
 a first comparator circuit coupled to the reference voltage generator and configured to receive an input signal, the first comparator circuit further configured to generate a first signal indicating whether the input signal is higher than the first reference voltage;
 a second comparator circuit coupled to the reference voltage generator and configured to receive the input signal, the second comparator circuit further configured to generate a second signal indicating whether the input signal is lower than the second reference voltage; and
 a latch coupled to the first comparator circuit and the second comparator circuit, the latch configured to be set to a first state if the first signal indicates the input signal is higher than the first reference voltage and to be set to a second state if the second signal indicates the input signal is lower than the second reference voltage.

2. The system of claim 1, wherein the latch is a set-reset latch comprising a set input for setting the latch to the first state and a clear input for setting the latch to the second state, the latch configured to receive the first signal at the set input and to receive the second signal at the clear input.

3. The system of claim 1, wherein the reference voltage generator comprises:
 an operational amplifier configured to output an output reference voltage being substantially the same as the input reference voltage;
 a current mirror configured to generate a first current based on the first control input; and
 a voltage divider coupled to the operational amplifier and the current mirror, the voltage divider configured to generate both a first voltage offset and a second voltage offset based on the first current, the first reference voltage being the sum of the output reference voltage and the first voltage offset, the second reference voltage being the difference between the output reference voltage and the second voltage offset.

4. The system of claim 3, wherein:
 the first comparator circuit comprises:
  a first differential amplifier configured to generate a third signal indicating whether the input signal is higher than the first reference voltage, the first differential amplifier having a rail-to-rail common mode input voltage range; and a first low-pass filter coupled to the first differential amplifier and configured to generate the first signal by low-pass filtering the third signal; and the second comparator circuit comprises:

a second differential amplifier configured to generate a fourth signal indicating whether the input signal is lower than the second reference voltage, the second differential amplifier having a rail-to-rail common mode input voltage range; and a second low-pass filter coupled to the second differential amplifier and configured to generate the second signal by low-pass filtering the fourth signal.

5. The system of claim 4, wherein a first capacitance of the first low-pass filter and a second capacitance of the second low-pass filter define a time hysteresis by filtering out voltage spikes having a duration less than a defined pulse width from the input signal.

6. The system of claim 5, wherein the first low-pass filter is configured to select the first capacitance based on a second control input and the second low-pass filter is further configured to select the second capacitance based on a third control input.

7. The system of claim 1, wherein:

the first comparator circuit comprises:

a first differential amplifier configured to generate a third signal indicating whether the input signal is higher than the first reference voltage; and a first low-pass filter coupled to the first differential amplifier and configured to generate the first signal by low-pass filtering the third signal; and the second comparator circuit comprises:

a second differential amplifier configured to generate a fourth signal indicating whether the input signal is lower than the second reference voltage; and a second low-pass filter coupled to the second differential amplifier and configured to generate the second signal by low-pass filtering the fourth signal.

8. The system of claim 7, wherein a first capacitance of the first low-pass filter and a second capacitance of the second low-pass filter define a time hysteresis by filtering out voltage spikes having a duration less than a defined pulse width from the input signal.

9. The system of claim 8, wherein the first low-pass filter is further configured to select the first capacitance based on a second control input and the second low-pass filter is further configured to select the second capacitance based on a third control input.

10. The system of claim 9, wherein the first differential amplifier and the second differential amplifier each comprise a rail-to-rail common mode input voltage range.

11. The system of claim 10, wherein the first differential amplifier generates a first bias voltage and a second bias voltage for self-biasing the first differential amplifier, and wherein the second differential amplifier generates a third bias voltage and a fourth bias voltage for self-biasing the second differential amplifier.

12. The system of claim 11, wherein the first differential amplifier further comprises a first transmission gate configured to separate the first bias voltage from the second bias voltage, and the second differential amplifier further comprises a second transmission gate configured to separate the third bias voltage from the fourth bias voltage.

13. The system of claim 11, wherein the first differential amplifier is further configured to determine the first bias voltage and the second bias voltage based on a fourth control input to select a low-power mode of operation for the first differential amplifier, and wherein the second differential amplifier is further configured to determine the third bias voltage and the fourth bias voltage based on a fifth control input to select a low-power mode of operation for the second differential amplifier.

14. The system of claim 4, wherein the first low-pass filter is further configured to generate the first signal by filtering out voltage spikes having a duration less than a first defined pulse width from the input signal, the second low-pass filter is further configured to generate the second signal by filtering out voltage spikes having a duration less than a second defined pulse width from the input signal, and the first defined pulse width and the second defined pulse width together define a time hysteresis for the input signal.

15. A method comprising:

generating a first reference voltage based on an input reference voltage;

generating a second reference voltage based on the input reference voltage, the first reference voltage being higher than the second reference voltage;

receiving an input signal;

generating a first signal indicating whether the input signal is higher than the first reference voltage by generating a third signal indicating whether the input signal is higher than the first reference voltage and low-pass filtering the third signal;

generating a second signal indicating whether the input signal is lower than the second reference voltage by generating a fourth signal indicating whether the input signal is lower than the second reference voltage and low-pass filtering the fourth signal;

setting a latch to a first state if the first signal indicates the input signal is higher than the first reference voltage; and setting the latch to a second state if the second signal indicates the input signal is lower than the second reference voltage.

16. The method of claim 15, wherein the first reference voltage and the second reference voltage define an amplitude hysteresis, the amplitude hysteresis being a voltage difference between the first reference voltage and the second reference voltage, the method further comprising:

selecting the first reference voltage; and selecting the second reference voltage.

17. The method of claim 16, wherein low-pass filtering the third signal and low-pass filtering the fourth signal define a time hysteresis by filtering out voltage spikes having a duration less than a defined pulse width from the input signal, low-pass filtering the third signal is based on a first capacitance, and low-pass filtering the fourth signal is based on a second capacitance, the method further comprising:

selecting the first capacitance; and selecting the second capacitance.

18. The method of claim 15, further comprising selecting either a normal mode of operation or a low-power mode of operation for generating the first signal and generating the second signal.

19. A system comprising:

means for generating a first reference voltage based on an input reference voltage;

means for generating a second reference voltage based on the input reference voltage, the first reference voltage being higher than the second reference voltage;

means for receiving an input signal;

means for generating a first signal indicating whether the input signal is higher than the first reference voltage;

means for generating a second signal indicating whether the input signal is lower than the second reference voltage;

means for generating a third signal indicating whether the input signal is higher than the first reference voltage;

means for low-pass filtering the third signal to generate the first signal;

means for generating a fourth signal indicating whether the input signal is lower than the second reference voltage;

means for low-pass filtering the fourth signal to generate the second signal;

means for setting a latch to a first state if the first signal indicates the input signal is higher than the first reference voltage; and means for setting the latch to a second state if the second signal indicates the input signal is lower than the second reference voltage.

20. The system of claim 19, further comprising means for selecting either a normal mode of operation or a low-power mode of operation for generating the first signal and generating the second signal.

21. The system of claim 19, wherein the first reference voltage and the second reference voltage define an amplitude hysteresis, the amplitude hysteresis being a voltage difference between the first reference voltage and the second reference voltage.

22. The system of claim 19, wherein the means for generating the first signal is further configured to generate the first signal by filtering out voltage spikes having a duration less than a first defined pulse width from the input signal, the means for generating the second signal is further configured to generate the second signal by filtering out voltage spikes having a duration less than a second define pulse width from the input signal, and the first defined pulse width and the second defined pulse width together define a time hysteresis for the input signal.

* * * * *

UNITED STATES PATENT AND TRADEMARK OFFICE
CERTIFICATE OF CORRECTION

| | | |
|---|---|---|
| PATENT NO. | : 7,714,620 B1 | Page 1 of 1 |
| APPLICATION NO. | : 11/422381 | |
| DATED | : May 11, 2010 | |
| INVENTOR(S) | : Chao Xu | |

It is certified that error appears in the above-identified patent and that said Letters Patent is hereby corrected as shown below:

IN THE SPECIFICATIONS:
Col. 5, line 27, "C" should read --CTL--
Col. 6, line 7, "minor" should read --mirror--

Signed and Sealed this
Sixth Day of March, 2012

David J. Kappos
*Director of the United States Patent and Trademark Office*